United States Patent [19]
Quon et al.

[11] Patent Number: 5,455,458
[45] Date of Patent: Oct. 3, 1995

[54] PHASE CHANGE COOLING OF SEMICONDUCTOR POWER MODULES

[75] Inventors: William Quon, Alhambra; Herbert J. Tanzer, Topanga, both of Calif.

[73] Assignee: Hughes Aircraft Company, Los Angeles, Calif.

[21] Appl. No.: 103,647

[22] Filed: Aug. 9, 1993

[51] Int. Cl.$^6$ .......................... H01L 23/02; H01L 25/04; H01L 23/48; H01L 39/02

[52] U.S. Cl. .......... 257/714; 257/712; 257/713; 257/716; 257/722; 361/698; 361/689; 361/699; 361/708; 361/697

[58] Field of Search ................... 257/712, 713, 257/714, 715, 716, 798, 722; 261/688, 689, 698, 699, 700; 428/64, 65, 195, 522; 361/688, 698, 699, 708, 689, 697

[56] References Cited

U.S. PATENT DOCUMENTS

| | | | |
|---|---|---|---|
| 4,323,914 | 4/1982 | Berndlmaier et al. | 257/714 |
| 4,335,781 | 6/1982 | Duffy | 257/714 |
| 5,185,194 | 2/1993 | Miyake et al. | 428/64 |
| 5,243,223 | 9/1993 | Yamada et al. | 257/714 |

*Primary Examiner*—Mark V. Prenty
*Assistant Examiner*—Carl Whitehead, Jr.
*Attorney, Agent, or Firm*—Leonard A. Alkov; W. K. Denson-Low

[57] ABSTRACT

Semiconductor wafer (22) and substrate (20) are enclosed in housing (12) on heat extracting base (14). The space within the housing is filled with a phase change material (28) which absorbs heat at a transitional temperature below the critical temperature of the semiconductor wafer to absorb heat during peak loads. Wires (44) thermally couple the wafer (22) to the phase change material (28). Heat is extracted from both the semiconductor wafer and the phase change material through the base (14).

17 Claims, 1 Drawing Sheet

PHASE CHANGE COOLING OF SEMICONDUCTOR POWER MODULES

FIELD OF THE INVENTION

This invention is directed to the structure of an electronic power module which has its wafer mounted so as to extract heat therefrom and which has its housing filled with a phase change material which changes phase and absorbs heat at a temperature below the critical temperature of the semiconductor electronics to reduce the upward temperature excursions of a semiconductor device which goes through periodic power cycles.

BACKGROUND OF THE INVENTION

Semiconductor electronic devices have internal losses which generate heat. When the electronic device is configured for a substantial amount of power, cooling is necessary in order to limit the semiconductor device to a sufficiently low temperature to provide a reasonable life. Power modules containing this type of semiconductor component are traditionally attached to a cold plate. The cold plate may have fins thereon with circulation of fluid therepast. The fluid is usually liquid when greater amounts of heat must be dissipated.

When semiconductor electronics are operated under steady-state conditions, heat flow and maximum temperatures at critical points can be readily controlled by such systems. However, some semiconductor power modules are subjected to periodic high-power cycles which must be limited in order to maintain the semiconductor device temperature within the acceptable range for that device. The reduction of upward temperature excursions increases the reliability of the semiconductor device by decreasing the thermally induced stress within the power module. Thus, there is need for an improved cooling structure by which semiconductor devices can have their peak temperature limited when subjected to intermittent major current loads.

SUMMARY OF THE INVENTION

In order to aid in the understanding of this invention, it can be stated in essentially summary form that it is directed to an electronic power module which has a dielectric phase change material directly in contact with the semiconductor power devices with the material changing phase and absorbing heat during semiconductor heating below the maximum tolerable semiconductor temperature.

It is thus a purpose and advantage of this invention to provide a power module which has enclosed therearound a phase change material which absorbs heat with increasing temperature below the maximum tolerable temperature of the semiconductor device.

It is another purpose and advantage of this invention to provide a dielectric conformal phase change material which is in direct contact with the semiconductor devices and which has an adequate coefficient of thermal conduction via extended area thermal conduction paths such as pins so that the pins act as heat paths for conducting heat away from semiconductor devices into the phase change material while the phase change material is in its solid or liquid forms.

It is a further purpose and advantage of this invention to provide a power module having a phase change material therein so that, as the power module is intermittently operated at high loads, the phase change material can absorb some of the heat during high load operation and release the heat during a low load portion of the operational cycle.

It is another purpose and advantage of this invention to provide phase change material in direct contact with a semiconductor device so that the phase change material can limit upward excursions of temperature during high-power operations and the phase change material can release the heat later externally of the power module.

Other purposes and advantages of this invention will become apparent from a study of the following portion of the specification, the claims and the attached drawings wherein:

DESCRIPTION OF THE PREFERRED EMBODIMENT

Figure 1:
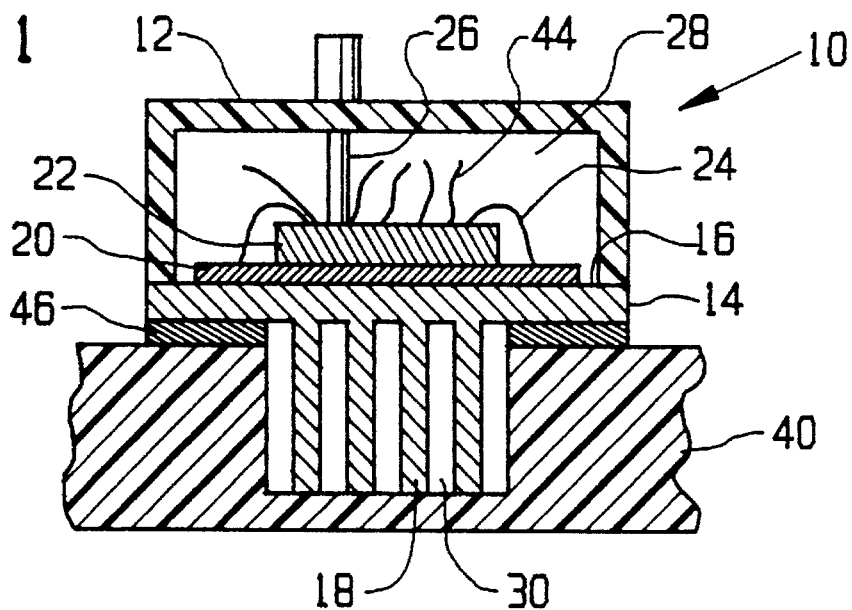
FIG. 1 is a sectional view through a semiconductor power module mounted on a cold plate and having phase change material therearound.

A power module having phase change cooling and configured in accordance with this invention is generally indicated at 10 in FIG. 1. In FIG. 1, the power module structure and its supporting cold plate is taken in section to schematically illustrate the equipment therein. The power module 10 comprises a base 14 which has an upper mounting surface 16 and which has a plurality of fins integrally formed therewith and extending out of the base on the side opposite the mounting surface. Fin 18 is specifically identified in FIG. 1, but it is seen that the fins are positioned under the active area of the upper mounting surface. The base 14 is sufficiently wide so that it can serve as an overlap cribed hereafter. The cover 12 is preferably of a dielectric material or has dielectric feedthroughs therethrough. The cover is secured to the outer edges of the base 14 at the sides, as seen in FIG. 1.

Mounted on top of the upper surface is the electronic substrate 20 on which the electronics are mounted. The substrate 20 is a dielectric material suitable to serve as a substrate for printed wiring for connection to the electronic devices. The substrate 20 may be of beryllium oxide, aluminum nitride, or similar materials on which semiconductors or semiconductor packages can be directly attached. Mounted on the substrate is the electronic stack indicated at 22 in FIG. 1. The substrate 20 is mounted on base 14. Base 14 is preferably a copper layer to achieve high thermal conductivity in a relatively inexpensive metal.

The electronic stack 22 has semiconductor electronic components therein, and particularly high-power electronics together with control components for controlling the main power flow. Connection 26 is shown as the power connection to the power junctions in the module. This electrical connection is shown as extending out of the top of the cover for external connection. The substrate 20 carries printed wiring on its upper surface, the surface on which the electronic stack 22 is mounted, and the wiring on the substrate is connected to the control electronics in the stack 22 by various wires, such as wire 24. The wire 24 is one of several interconnecting wires between the electronic stack and the printed wiring on the top of the substrate. In addition, the control connections are brought from the electronic stack and from the printed wiring on the substrate out of the cover in a similar way, but with suitably smaller conductors. The semiconductor devices in the silicon wafer generate the heat which must be extracted to maintain the silicon wafer at a sufficiently low temperature that it remains operative over a long life. The steady state heat is conducted downward through the substrate to the base layer 14 and its fins.

Cold plate 40 has the usual fluid inlet and fluid outlet. The inlet and outlet are connected to a source of disposal of a suitable coolant fluid, as is conventional. The cold plate 40 may be a conventional flat cold plate with the base 14 clamped directly to the outer surface thereof. On the other hand, the cold plate may have a passage 30 therein which receives the coolant flow and accepts the fins 18, as illustrated in FIG. 1. Since the cold plate 40 has no need for providing low resistance thermal connections, flatness is not a problem, and it can be made out of any convenient material, such as die-cast aluminum or molded synthetic polymer composition material. The base 14 is mounted on the cold plate with a gasket 46 therebetween to avoid coolant leakage out of the face of the cold plate. The power modules are held in place on the face of the cold plate by any convenient means.

The cover 12 over the base 14 leaves a space 28 directly around the power module. Preferably, the power module 22 is of such nature that the semiconductor devices therein are exposed. The space 28 is filled with a dielectric phase change material which changes from a more solid form to a more liquid form, absorbing heat, as the temperature rises, at a temperature lower than the critical upper limit temperature of the semiconductor device. The phase change material must have several characteristics. It must absorb heat by phase change at an appropriate temperature. For silicon semiconductors, a state change between 10 degrees C. and 20 degrees C. below desired maximum junction temperature is desirable. The phase change material is preferably conformable so that it lies against the semiconductor devices and their leads in order to readily absorb heat therefrom. In addition, the phase change material must have a low thermal resistance because the heat must be conducted away.

Finally, the phase change material must be reversible so that, as the temperature decreases, it changes back into the initial state and is again ready for a heat surge. Included within this group of phase change materials is the broad group of organic materials including paraffins. Suitable within the paraffin group are triacontane-$C_{30}H_{62}$, Dotricontane-$C_{32}H_{66}$, Tritriacontane-$C_{33}H_{68}$, etc.

Another class of material which fits the requirements is non-paraffin organics such as Beeswax, Oxazoline wax and Acetamide-$C_2H_5ON$. The phase change material 28 desirably has a low resistance of thermal conduction. However, that criteria is not found in the available phase change materials listed above. They are of generally low thermal conductivity. In order to conduct the heat from the electronic stack 22 into the solid phase change material, the connecting wires between the electronic stack and the substrate are very helpful. In addition, short wires extending into the space 28 are bonded to suitable pads on the electronic stack. Wire 44 is illustrated in FIG. 1 along with several other similar wires. These wires may be attached in the same manner and may be of the same material as the wires 24. However, the wires 24 are not connected to any other point for electrical purposes. These separate wires also permit conduction of heat from the electronic stack into the body of the phase change material.

The phase change material in space 28 is located where prior practice usually places an encapsulant. The encapsulant, or potting material, prevents condensation from collecting on the connections. The phase change material must be selected as one which would prevent water from collecting on the conductors, assuming that the phase change material does not separate from the surfaces. In that case, it acts like its own conformal coating. If the phase change material would tend to separate, a separate conformal coating would be required on the circuitry and dies. This conformal material can be very thin because it is protected by the dielectric phase change material in the space 28.

Figure 2:
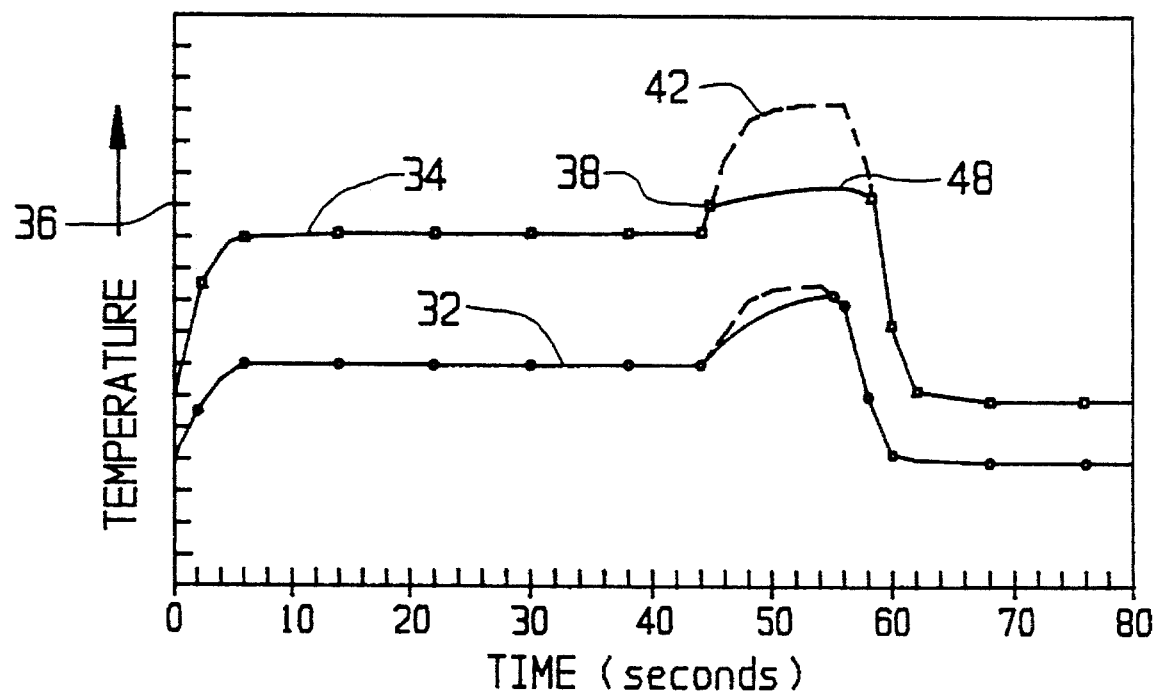
FIG. 2 is a graph of temperature versus time for moderate load, followed by peak load followed by minimal load operation of the semiconductor power module with phase change cooling, in accordance with this invention.

FIG. 2 shows a graph of temperature versus time wherein line 32 is the temperature at the surface 16 of the heat sink base 14. Line 34 is the temperature at the actual surface of the semiconductor die. The power module 22 is assumed to be mounted in a system where it may be controlled to deliver zero current, minimal current, moderate current, or peak current to a load. The load may be the drive motors of a battery-powered automobile or industrial vehicle. The current delivered by the power module would correspond to the mechanical load.

At time zero, the vehicle starts up a moderate upgrade. The temperature at the chip, represented by line 34, and the temperature at the cold plate, represented by line 32, quickly reach equilibrium. The equilibrium temperature at the chip is below the liquefaction temperature of the phase change material, represented by temperature point 36. The vehicle operates on a steady upgrade to about 44 seconds where it is required to accelerate. The temperature at the semiconductor chip quickly rises, but when it reaches the point 38, which is the same temperature as point 36, the phase change material 28 changes phase from its more solid to its more liquid condition, absorbing heat. This limits the temperature at the chip as long as the peak load represented by this acceleration is of sufficiently limited heat load that all of the phase change material does not change phase. The changing of the phase limits the temperature to the point 48. If the phase change material were not present, the dashed line 42 represents the temperature excursion at the chip. It is seen that the temperature at the base is also limited. The line 32 represents the base 14 surface temperature, and that also is lower during the peak load than if the phase change material were absent, shown by the dashed lines.

The peak load is discontinued at 56 seconds, and the load past 60 seconds represents level, constant speed driving, which is minimal load compared to the moderate load of uphill driving. The system again reaches steady state with the chip below the temperature 36 so that heat is extracted from the phase change material through the cold plate and the phase change material returns to the lower energy solid state where it is again ready to absorb heat. In this way, the temperatures are controlled. The position of the phase change material directly adjacent the chip is critical in holding that temperature to a reasonable value.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A semiconductor cooling system (10) comprising:

a base (14) with an upper mounting surface (16), said base having a plurality of fins (18) integrally formed therewith and extending out of said base (14) on a side opposite said mounting surface (16);

a cold plate (40) in connection with said base (14) for extracting heat from said base (14);

a semiconductor wafer (20) mounted on said base (40), said semiconductor wafer (20) having a critically high temperature at which reduction in functionality of said semiconductor wafer (20) occurs;

an electronic stack (22) mounted on said semiconductor wafer (20), said stack (22) having semiconductor electronic components thereon;

a housing (12) surrounding said semiconductor wafer (20) enclosing said semiconductor wafer (20) and leaving a space (28) around said semiconductor wafer (20); and a phase change material within said housing (12) around said semiconductor wafer (20), said phase change material changing from a lower energy state to a higher energy state a temperature below the critically high temperature of said semiconductor wafer (20).

2. The semiconductor cooling system of claim 1 wherein said phase change material is a dielectric material.

3. The semiconductor cooling system of claim 2 wherein said phase change material is an organic material which changes from a more solid form to a more liquid form with an increase in temperature at the transition temperature, with absorption of heat.

4. The semiconductor cooling system of claim 3 wherein said phase change material is a paraffin selected from the group consisting of triacontane ($C_{30}H_{62}$), Dotricontane-$C_{32}H_{66}$, Tritriacontane-$C_{33}H_{68}$, etc.

5. The semiconductor cooling system of claim 3 wherein said phase change material is a non-paraffin organic material selected from the group consisting of Beeswax, Oxazoline wax and Acetamide-$C_2H_5ON$.

6. The semiconductor cooling system of claim 3 wherein said semiconductor wafer has wire leads extending therefrom and into said organic phase change material so as to conduct heat from said semiconductor wafer into said organic phase change material.

7. The semiconductor cooling system of claim 6 wherein at least some of said wires attached to said wafer serve only as heat paths from said wafer into said organic phase change material.

8. A semiconductor cooling system (10) comprising:

a base (14) With an upper mounting surface (16), said base (14) having a plurality of fins (18) integrally formed therewith and extending out of said base (14) on a side opposite said mounting surface (16);

a semiconductor wafer (20) having a critically high temperature above which semiconductor life is reduced mounted on said base (14), said semiconductor wafer (20) having exposed electric leads (44) thereon;

an electronic stack (22) mounted on said semiconductor wafer (20), said stack (22) having semiconductor electronic components thereon;

a housing (12) mounted on said base (14) and surrounding said semiconductor wafer (20) and enclosing said semiconductor wafer (20) with a space (28) within said housing (12) around said semiconductor wafer (20); and a phase change material within said housing (12) and in contact with said semiconductor wafer (20) and said leads (44), said phase change material having a transition temperature from a lower energy state to a higher energy state at a temperature below the critical temperature of said semiconductor wafer (20).

9. The semiconductor cooling system of claim 8 wherein said phase change material changes from a more solid state to a more liquid state as it absorbs heat at its transition temperature.

10. The semiconductor cooling system of claim 9 wherein said phase change material is in contact with said base and said means to remove heat is connected to remove heat from said base so that when said means to remove heat removes heat from said phase change material and it reduces said phase change material to a temperature below its transition temperature, said means to remove heat removes heat from said phase change material to lower it to its lower energy state.

11. The semiconductor cooling system of claim 10 wherein said phase change material is dielectric.

12. The semiconductor cooling system of claim 11 wherein said phase change material is a paraffin selected from the group consisting of triacontane ($C_{30}H_{62}$), Dotricontane-$C_{32}H_{66}$, Tritriacontane-$C_{33}H_{68}$, etc.

13. The semiconductor cooling system of claim 11 wherein said phase change material is a non-paraffin organic material selected from the group consisting of Beeswax, Oxazoline wax and Acetamide-$C_2H_5ON$.

14. The semiconductor cooling system of claim 8 wherein said semiconductor wafer has wire leads extending therefrom and into said organic phase change material so as to conduct heat from said semiconductor wafer into said organic phase change material.

15. The semiconductor cooling system of claim 14 wherein at least some of said wires attached to said wafer serve only as heat paths from said wafer into said organic phase change material.

16. The semiconductor cooling system of claim 8 wherein said semiconductor wafer is in the power control system of an electric vehicle and the temperature reached by said semiconductor wafer in normal operation is below said transitional temperature and said transitional temperature is reached by said semiconductor wafer only when said electrical vehicle subjects said semiconductor wafer to peak loads.

17. The semiconductor cooling system of claim 15 wherein said semiconductor wafer is in the power control system of an electric vehicle and the temperature reached by said semiconductor wafer in normal operation is below said transitional temperature and said transitional temperature is reached by said semiconductor wafer only when said electrical vehicle subjects said semiconductor wafer to peak loads.

* * * * *